United States Patent [19]
Mack et al.

[11] Patent Number: 5,959,305
[45] Date of Patent: Sep. 28, 1999

[54] METHOD AND APPARATUS FOR MONITORING CHARGE NEUTRALIZATION OPERATION

[75] Inventors: Michael E. Mack, Manchester; Michel Pharand, Woburn; Paul E. Lustiber, Chelmsford; David J. Fish, Melrose, all of Mass.

[73] Assignee: Eaton Corporation, Cleveland, Ohio

[21] Appl. No.: 09/099,997

[22] Filed: Jun. 19, 1998

[51] Int. Cl.⁶ .................................................. H01J 37/317
[52] U.S. Cl. ..................................... 250/492.21; 250/251
[58] Field of Search ............................... 250/492.21, 251

[56] References Cited

U.S. PATENT DOCUMENTS

| | | | |
|---|---|---|---|
| 4,804,837 | 2/1989 | Farley | 250/251 |
| 4,914,292 | 4/1990 | Tamai et al. | 250/251 |
| 5,089,710 | 2/1992 | Kikuchi et al. | 250/492.3 |
| 5,148,034 | 9/1992 | Koike | 250/251 |
| 5,164,599 | 11/1992 | Benveniste | 250/492.2 |
| 5,343,047 | 8/1994 | Ono et al. | 250/492.21 |
| 5,378,899 | 1/1995 | Kimber | 250/492.21 |
| 5,399,871 | 3/1995 | Ito et al. | 250/492.21 |
| 5,531,420 | 7/1996 | Benveniste | 250/251 |
| 5,633,506 | 5/1997 | Blake | 250/492.21 |
| 5,691,537 | 11/1997 | Chen et al. | 250/251 |
| 5,703,375 | 12/1997 | Chen et al. | 250/492.21 |

OTHER PUBLICATIONS

Current, Michael I., et al., "Beam–plasma Concepts for Wafer Charging Control During Ion Implantation," *Ion Implantation Technology*, IEEE, pp. 53–56 (1997).

Dixon, William, et al., "Photoresist–Enhanced Wafer Charging During High Current Ion Implantation," *Ion Implantation Technology*, IEEE, pp. 85–88 (1997).

Heremans, Paul, et al., "Analysis of the Charge Pumping Technique and Its Application for the Evaluation of MOSFET Degradation," *IEEE Transactions on Electron Devices*, vol. 36, No. 7, pp. 1318–1335 (Jul. 1989).

Hutchinson, I.H., *Principles of Plasma Diagnostics*, Cambridge University Press, 9 sheets containing copies of the first 18 pages of Chapter 3 which is titled "Plasma particle flux" (1987).

Mack, M.E., et al., "Progress in Wafer Charging and Charge Neutralization," *Nuclear Instruments and Methods in Physics Research*, vol. B74, pp. 287–290 (1993).

*Primary Examiner*—Kiet T. Nguyen
*Attorney, Agent, or Firm*—Watts, Hoffman, Fisher & Heinke, Co., L.P.A.

[57] ABSTRACT

A charge neutralization monitor monitors the operation of a charge neutralization system for an ion implantation system. The charge neutralization system produces neutralizing electrons in a region through which an ion beam passes in treating one or more workpieces. The charge neutralization monitor applies a suitable voltage to a target electrode positioned to collect neutralizing electrons produced by the charge neutralization system. The charge neutralization monitor then determines the available neutralizing electron current that may be produced by the charge neutralization system by monitoring the current flowing through the target electrode.

27 Claims, 1 Drawing Sheet

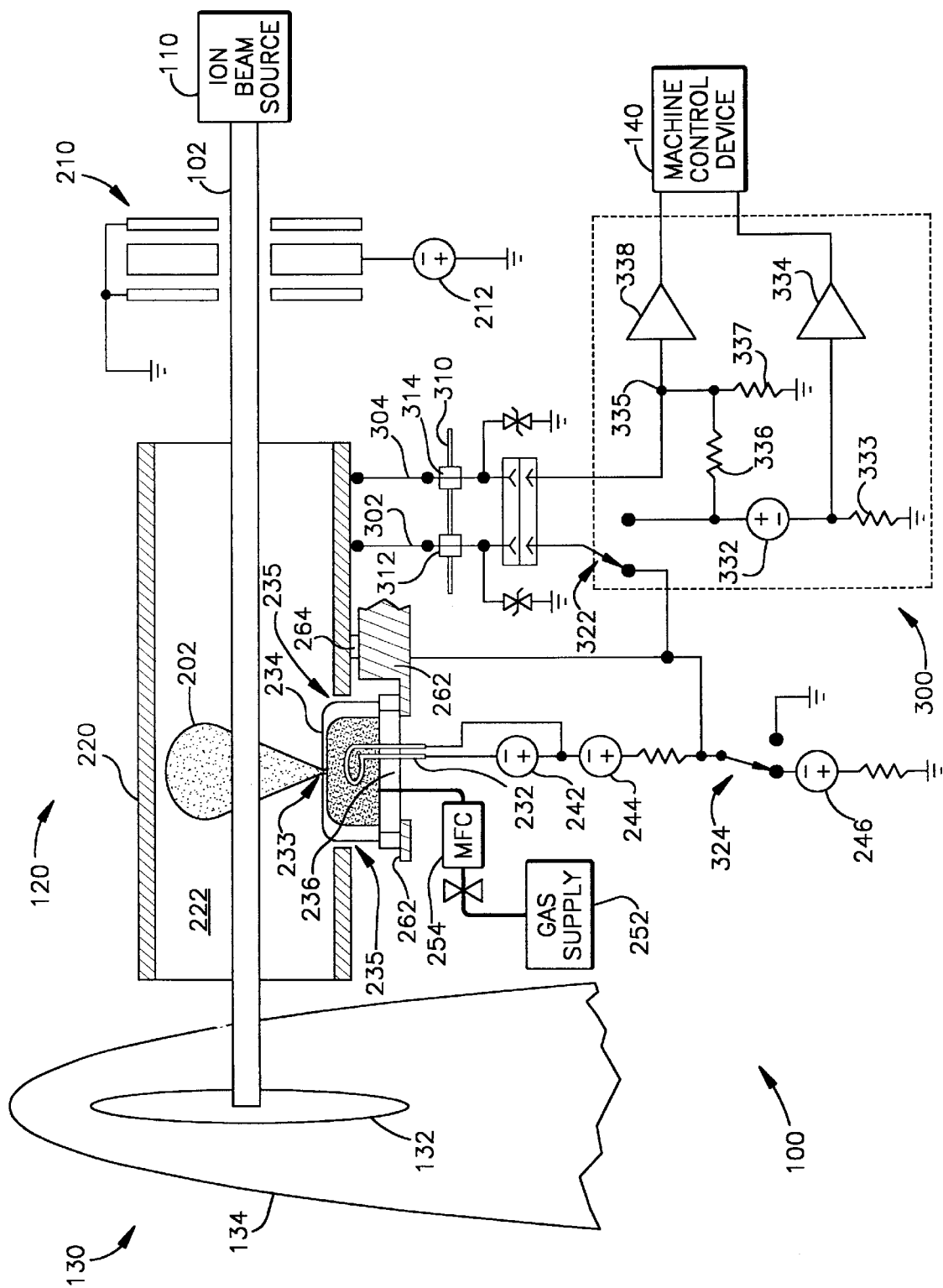

METHOD AND APPARATUS FOR MONITORING CHARGE NEUTRALIZATION OPERATION

FIELD OF THE INVENTION

The present invention relates generally to the field of ion implantation. More particularly, the present invention relates to the field of charge neutralization for ion implantation.

BACKGROUND OF THE INVENTION

Ion implanters are used to treat a workpiece with an ion beam. Ion implanters may be used, for example, to implant or dope silicon wafers with a selected ion species as desired to produce n-type or p-type extrinsic materials in fabricating semiconductor integrated circuits.

Typical ion implanters comprise an ion source for generating positively-charged ions from ionizable source materials and beam forming and shaping structure for forming the generated ions into a beam and for accelerating the ions along a predetermined path for implantation into one or more wafers at an implantation station. As the ion beam strikes the wafer, however, the wafer acquires a net positive charge. Such charging is often non-uniform and can create large electric fields at the surface of the wafer, possibly damaging the wafer. Wafers containing oxide layers, for example, can experience dielectric breakdown when wafer charging occurs.

To prevent damaging wafers in this manner, typical implanters comprise an electron shower or flood system to introduce low-energy electrons in the vicinity of the ion beam to neutralize the positively-charged ion beam and wafer surface. In a plasma electron flood (PEF) system, for example, a filament is heated to emit thermoelectrons within an arc chamber having a positive voltage bias with respect to the filament. The thermoelectrons react with a suitable gas supplied to the arc chamber to produce a plasma comprising neutralizing electrons that may be introduced in the vicinity of the ion beam through an extraction orifice in the arc chamber.

The continued trend toward thinner gate oxides requires relatively stringent control over charge neutralization to control electrical stress of gate oxide during ion implantation. Because the charge neutralization operation performed by a PEF system depends on a number of factors such as, for example, filament current, filament condition, arc current, arc chamber condition, gas purity, gas flow, proper assembly of the PEF system, etc., the operation of the PEF system should be monitored to help control charge neutralization for relatively charge-sensitive devices.

SUMMARY OF THE INVENTION

A method and apparatus monitor a charge neutralization operation in an ion implantation system that generates an ion beam to treat one or more workpieces.

For the method, neutralizing electrons are produced in a region through which the ion beam passes in treating one or more workpieces. A plasma comprising neutralizing electrons may be produced in a chamber for introduction into the region through which the ion beam passes.

Current flowing through a target electrode positioned to collect neutralizing electrons produced in the region is monitored to determine available charge neutralization electron current. The target electrode may be biased with a voltage, and current flowing through the target electrode may be monitored while the ion beam is absent from the region. The monitored current may be compared with a predetermined current level. A voltage level at the target electrode may also be monitored.

The target electrode may be a passage body defining an interior region through which the ion beam passes. With neutralizing electrons produced using a plasma producing chamber, the passage body may be electrically isolated from the plasma producing chamber while current flowing through the passage body is monitored and may be electrically connected to the plasma producing chamber during treatment of the one or more workpieces with the ion beam.

An apparatus comprises suitable means for similarly monitoring a charge neutralization operation in an ion implantation system. The apparatus may be used in combination with means for generating and directing the ion beam through the region and means for supporting the one or more workpieces for treatment with the ion beam.

A charge neutralization system comprises an electron flood system for producing neutralizing electrons in the region through which the ion beam passes and circuitry for monitoring current flowing through the target electrode. The electron flood system may be a plasma electron flood system. A data processing system may compare the monitored current with a predetermined current level. The charge neutralization system may be used in combination with an ion beam source for generating and directing the ion beam through the region and an implantation station for supporting the one or more workpieces for treatment with the ion beam.

BRIEF DESCRIPTION OF THE DRAWINGS

The present invention is illustrated by way of example and not limitation in the FIGURE of the accompanying drawing, in which:

The sole FIGURE illustrates, for one embodiment, a schematic diagram of an ion implantation system comprising a charge neutralization monitor.

DETAILED DESCRIPTION

A charge neutralization monitor in accordance with the present invention monitors the operation of a charge neutralization system for an ion implantation system.

ION IMPLANTATION SYSTEM

The sole FIGURE illustrates, for one embodiment, a schematic of an ion implantation system 100 for treatment of one or more wafers 132 with an ion beam 102. As illustrated in the sole FIGURE, ion implantation system 100 comprises an ion beam source 110 for generating ion beam 102, a charge neutralization system 120 for introducing neutralizing electrons in the vicinity of ion beam 102, and an implantation station 130 where one or more wafers 132 are treated with ion beam 102. Although described as treating one or more wafers 132, ion implantation system 100 may be used for treatment of other suitable workpieces.

Ion beam source 110 may comprise any suitable equipment for generating ion beam 102 in any suitable manner. For one embodiment, ion beam source 110 comprises an ion source for generating positively-charged ions from ionizable source materials and beam forming and shaping structure for forming the generated ions into ion beam 102 and for accelerating the ions of ion beam 102 along an evacuated path through charge neutralization system 120 to implantation station 130.

Ion beam source 110 may comprise, for example, a plasma chamber in which energy is applied to suitable source materials injected in the plasma chamber to generate positively-charged ions. The ions may be extracted through a slit in the plasma chamber and accelerated toward a mass analyzer using electrodes to form ion beam 102. The mass analyzer causes the ions of ion beam 102 to move in a curved trajectory such that only ions of an appropriate atomic mass remain in ion beam 102. Ion beam source 110 may also comprise a quadrapole assembly to adjust the height of ion beam 102 and a Faraday flag that may be pivoted into the path of ion beam 102, for example, to measure characteristics of ion beam 102 and that may be withdrawn from the path of ion beam 102 during treatment of one or more wafers 132.

Charge neutralization system 120 introduces neutralizing electrons in the vicinity of ion beam 102 to help prevent charging of one or more wafers 132 by ion beam 102 at implantation station 130.

Implantation station 130 supports one or more wafers 132 for treatment by ion beam 102. Implantation station 130 may support one or more wafers 132 for treatment in any suitable manner. As illustrated in the sole FIGURE, implantation station 130 for one embodiment comprises a support 134 mounted for rotation about an axis. Support 134 supports a plurality of wafers 132 about its outer periphery and is rotated by a motor to move wafers 132 along a circular path intersecting ion beam 102 such that ion beam 102 impacts wafers 132 as they pass through ion beam 102.

Suitable equipment for generating and transporting an ion beam through a charge neutralization system to an implantation station are disclosed, for example, in U.S. Pat. No. 5,164,599 issued to Benveniste, U.S. Pat. No. 5,531,420 issued to Benveniste, U.S. Pat. No. 5,633,506 issued to Blake, U.S. Pat. No. 5,691,537 issued to Chen et al., and U.S. Pat. No. 5,703,375 issued to Chen et al.

CHARGE NEUTRALIZATION SYSTEM

Charge neutralization system 120 comprises an electron shower passage body 220 that defines an interior region 222 through which ion beam 102 passes from ion beam source 110 to implantation station 130, as illustrated in the sole FIGURE. Charge neutralization system 120 introduces neutralizing electrons in interior region 222 of passage body 220 and therefore in the vicinity of ion beam 102 to help prevent charging of one or more wafers 132 by ion beam 102 at implantation station 130.

Charge neutralization system 120 for one embodiment may also comprise an aperture defining member 210 through which ion beam 102 passes upstream from passage body 220. Aperture defining member 210 is negatively biased by a biased aperture power supply 212 to help prevent blow-up of ion beam 102 as discussed in U.S. Pat. No. 5,691,537 to Chen et al., for example. Biased aperture power supply 212 may apply any suitable voltage, such as approximately −2.5 kilovolts for example, to aperture defining member 210.

As illustrated in the sole FIGURE, charge neutralization system 120 for one embodiment comprises a plasma electron flood (PEF) system in which a filament 232 is heated to thermionic temperatures by a filament power supply 242 to emit thermoelectrons within an arc chamber 234 biased with a positive voltage relative to filament 232 by an arc power supply 244. The thermoelectrons react with a suitable gas within arc chamber 234 so as to produce a plasma 202 comprising neutralizing electrons. Plasma 202 produced in arc chamber 234 is introduced in interior region 222 through an extraction orifice 233 in arc chamber 234.

Passage body 220 may be formed of any suitable conductive material and for one embodiment is formed of aluminum with a graphite lining in interior region 222. Passage body 220 may have any suitable shape and for one embodiment is tubular or cylindrical in shape. Passage body 220 for one embodiment completely surrounds ion beam 102 yet for other embodiments may surround only a portion of ion beam 102.

Arc chamber 234 may be mounted relative to passage body 220 in any suitable manner such that plasma 202 produced in arc chamber 234 is directed through extraction orifice 233 into interior region 222 of passage body 220. Arc chamber 234 may be formed of any suitable conductive material, such as molybdenum for example. Arc chamber 234 comprises a base insulator 236 that may comprise any suitable material, such as boron nitride for example.

As illustrated in the sole FIGURE, arc chamber 234 for one embodiment is supported by a cooled support 262 (partially shown in the sole FIGURE) and is mounted within a side wall of passage body 220 such that arc chamber 234 is electrically insulated from the side wall of passage body 220 by an evacuated region 235 around arc chamber 234. Cooled support 262 also helps support passage body 220. Cooled support 262 comprises a conductive material and is electrically connected to arc chamber 234 yet is electrically insulated from passage body 220 by an insulator block 264.

Gas may be routed to arc chamber 234 for one embodiment from a gas supply 252 through base insulator 236, as illustrated in the sole FIGURE. The gas may comprise argon or xenon, for example, and the flow of gas into arc chamber 234 may be regulated by a mass flow controller (MFC) 254. Gas may be supplied to arc chamber 234 at any suitable flow rate, such as in the range of approximately 0.2 sccm to approximately 0.8 sccm for xenon, for example, and in the range of approximately 1.5 sccm to approximately 3 sccm for argon, for example.

Filament 232 for one embodiment is mounted within arc chamber 234 through base insulator 236 as illustrated in the sole FIGURE. Filament 232 may have any suitable shape and may be formed of any suitable material, such as tungsten for example. Filament power supply 242 may induce any suitable current, such as in the range of approximately 150 amperes to approximately 200 amperes for example, through filament 232. Filament power supply 242 for one embodiment may be adjusted so as to apply a variable voltage up to approximately 5 volts, for example, across filament 232.

For one embodiment, filament 232 is shaped to form, for example, an approximately 2.3 millimeter diameter generally circular shape. The thermionic heating of filament 232 with currents in the range of approximately 160 amperes to approximately 180 amperes, for example, provides a confining magnet field of approximately 400 Gauss, for example, for plasma 202 within arc chamber 234. The shape of filament 232 for one embodiment is such that the magnetic field within arc chamber 234 dissipates relatively rapidly to less than approximately 10 Gauss, for example, toward extraction orifice 233.

Arc power supply 244 may apply a variable voltage in the range of approximately 0 volts to approximately 48 volts, for example, to arc chamber 234 relative to filament 232 and may induce a current in the range of approximately 0.1 amperes to approximately 4 amperes, for example, through arc chamber 234. Arc power supply 244 for one embodiment may bias arc chamber 234 with approximately 23 volts relative to filament 232. Arc power supply 244 may be electrically connected to arc chamber 234 in any suitable manner such as, for example, through cooled support 262 as illustrated in the sole FIGURE.

Filament 232 and arc chamber 234 are both grounded or negatively biased by a bias power supply 246. Bias power supply 246 may apply a variable voltage in the range of approximately 0 volts to approximately −6 volts, for example, to both filament 232 and arc chamber 234.

Passage body 220 is electrically connected to arc chamber 234 during ion implantation and is therefore likewise grounded or negatively biased by bias supply 246. Passage body 220 for one embodiment may be negatively biased to help retain electrons within passage body 220.

CHARGE NEUTRALIZATION MONITOR

The performance of charge neutralization system 120 depends on a number of factors such as, for example, the amount of current flowing through filament 232, the condition of filament 232, the amount of current flowing through arc chamber 234, the condition of arc chamber 234, the purity of the gas supplied to arc chamber 234, the flow of gas to arc chamber 234, the condition of extraction orifice 233, the manner in which charge neutralization system 120 was assembled, etc. Although the current flowing through arc chamber 234 may be monitored to control the current flowing through filament 232 and therefore control the current of charge neutralizing electrons in interior region 222 of passage body 220, the amount of current flowing through arc chamber 234 may not reveal plasma electron losses due to, for example, impurities in the gas supplied to arc chamber 234, any gas leakage and excessive or inadequate gas flow to arc chamber 234, improper assembly of charge neutralization system 120, and/or deposits on the insulators in arc chamber 234.

Charge neutralization system 120 comprises a charge neutralization monitor 300 to monitor the available neutralizing electron current that may be produced by charge neutralization system 120. Prior to performing an ion implantation operation, monitor 300 monitors the available neutralizing electron current by applying a suitable voltage to passage body 220 while passage body 220 is electrically isolated from arc chamber 234. As charge neutralization system 120 produces plasma 202, the sidewalls of passage body 220 collect electrons from plasma 202. Monitor 300 may then monitor the ability of charge neutralization system 120 to produce neutralizing electrons by monitoring the current flowing through passage body 220. Monitor 300 may comprise any suitable circuitry for monitoring charge neutralization system 120.

To perform ion implantation, monitor 300 for one embodiment invokes charge neutralization system 120 into an operate mode by electrically connecting a conductor 302 electrically connected to passage body 220 to arc chamber 234 with a switch 322 and also by electrically connecting both filament power supply 242 and arc power supply 244 to bias power supply 246 with a switch 324. Monitor 300 electrically connects passage body 220 to arc chamber 234 during ion implantation to help maintain potential control of ion beam 102.

To monitor available neutralizing electron current produced by charge neutralization system 120, monitor 300 for one embodiment invokes charge neutralization system 120 into a test mode by electrically isolating passage body 220 from arc chamber 234 and electrically connecting passage body 220 by way of conductor 302 to a test power supply 332 with switch 322. Test power supply 332 may apply any suitable voltage, such as in the range of approximately 0 volts to approximately 20 volts for example. Test power supply 332 for one embodiment applies approximately 5 volts to passage body 220. Monitor 300 also electrically grounds arc chamber 234 with switch 324.

As charge neutralization system 120 introduces neutralizing electrons into interior region 222, monitor 300 for one embodiment monitors the current flowing through passage body 220 by monitoring the current flowing through a resistor 333 connected between the cathode terminal of test power supply 332 and ground. Resistor 333 may have any suitable resistance, such as approximately 10 ohms for example. The monitored current for one embodiment is amplified by an operational amplifier (op amp) 334.

Monitor 300 for one embodiment monitors the current flowing through passage body 220 with ion beam 102 absent from interior region 222 of passage body 220. Monitor 300 may be configured to turn off ion beam source 110 or to block ion beam 102 using, for example, a suitable Faraday flag upstream from charge neutralization system 120 so ion beam 102 is absent from interior region 222 of passage body 220 while charge neutralization system 120 is in the test mode. As charge neutralization system 120 produces plasma 202 in the test mode with ion beam 102 absent from interior region 222, passage body 220 simulates the presence of ion beam 102 and collects electrons from plasma 202. Monitor 300 may alternatively monitor the current flowing through passage body 220 with ion beam 102 present in interior region 222 of passage body 220. The results may be more readily interpreted, however, with ion beam 102 absent from interior region 222.

Monitor 300 for one embodiment may also verify the voltage applied to passage body 220 by monitoring the voltage level at a node 335 coupled to a conductor 304 electrically connected to passage body 220. While charge neutralization system 120 is in the operate mode, monitor 300 may verify the voltage applied to passage body 220 by bias supply 246. Monitor 300 may also verify the voltage applied to passage body 220 by test power supply 332 while charge neutralization system 120 is in the test mode. A resistor 336 is connected between the anode terminal of test power supply 332 and node 335, and another resistor 337 is connected between node 335 and ground. Resistors 336 and 337 form a voltage divider. If test power supply 332 is not properly connected to passage body 220 while charge neutralization system 120 is in the test mode, the voltage at node 335 will be less than that provided by test power supply 332 as determined by the voltage divider formed by resistors 336 and 337. Resistors 336 and 337 may each have any suitable resistance such as, for example, approximately 3,000 ohms and approximately 3,000 ohms, respectively. The monitored voltage for one embodiment is amplified by an operational amplifier (op amp) 338.

Conductors 302 and 304 for one embodiment are routed through suitable vacuum wiring harnesses 312 and 314, respectively, of a vacuum flange 310 (partially shown in the sole FIGURE) and are directly connected to the outer wall of passage body 220. Vacuum flange 310 helps maintain the evacuated path for ion beam 102.

Monitor 300 for one embodiment uses a suitable machine control device 140 for monitoring charge neutralization system 120. Machine control device 140 comprises a digital data processing system for controlling the operation and performance of ion implantation system 100 including ion beam source 110, charge neutralization system 120 including monitor 300, and implantation station 130. Machine control device 140 may monitor the current and voltage of passage body 220 using suitable analog-to-digital (A/D) converters, for example.

For a given set of charge neutralization parameters such as gas flow, arc current, arc voltage, etc., the available neutralizing electron current should be relatively consistent from machine to machine and as a function of time on a given machine. A user of machine control device 140 may therefore use monitor 300 for charge neutralization system checking. The user may use monitor 300 for one embodiment in a manual mode or in an automatic mode.

For manual mode, the user may invoke charge neutralization system 120 in the operate or test mode using a suitable input/output interface of machine control device 140. The user may set various charge neutralization parameters as desired. While charge neutralization system 120 is in the test mode, machine control device 140 monitors and outputs the current and voltage of passage body 220 for review by the user.

For automatic mode, machine control device 140 sets the charge neutralization parameters to internally defined values, and charge neutralization system 120 is invoked in the test mode prior to implant start for implant recipes using charge neutralization system 120. Machine control device 140 compares the monitored current of passage body 220 with two predetermined current levels: a normal current level and a service current level. If the monitored current is greater than the normal current level, machine control device 140 determines charge neutralization system 120 is operating properly. If the monitored current is less than the normal current level but greater than the service current level, machine control device 140 determines the performance of charge neutralization system 120 is degrading and outputs a warning. If the monitored current is less than the service current level, machine control device 140 determines charge neutralization system 120 is not operating properly and may output a warning and/or invoke ion implantation system 100 in a hold state. Machine control device 140 may also store monitored current and voltage values for each test automatically initiated.

In monitoring the voltage applied to passage body 220, machine control device 140 may output an error message if the voltage applied to passage body 220 deviates from that expected for the operate or test mode of charge neutralization system 120. Machine control device 140 may also output an error message if the charge neutralization parameter settings cannot or should not be implemented.

Although described as monitoring current flowing through passage body 220 of charge neutralization system 120 for one embodiment, monitor 300 may use any suitable target electrode positioned to collect neutralizing electrons produced by any suitable charge neutralization system in a region through which an ion beam passes.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method for monitoring a charge neutralization operation in an ion implantation system that generates an ion beam to treat one or more workpieces, the method comprising the steps of:
   (a) producing neutralizing electrons in a region through which the ion beam passes in treating one or more workpieces; and
   (b) monitoring current flowing through a target electrode positioned to collect neutralizing electrons produced in the region to determine available charge neutralization electron current.

2. The method of claim 1, wherein the monitoring step (b) comprises the step of biasing the target electrode with a voltage.

3. The method of claim 1, wherein the target electrode is a passage body defining an interior region through which the ion beam passes.

4. The method of claim 1, wherein the producing step (a) comprises the step of producing a plasma comprising neutralizing electrons in the region through which the ion beam passes.

5. The method of claim 1, wherein the monitoring step (b) comprises the step of monitoring current flowing through the target electrode while the ion beam is absent from the region.

6. The method of claim 1, comprising the step of comparing the monitored current with a predetermined current level.

7. The method of claim 1, comprising the step of monitoring a voltage level at the target electrode.

8. The method of claim 1, wherein the target electrode is a passage body defining an interior region through which the ion beam passes; and
   wherein the producing step (a) comprises the step of producing a plasma comprising neutralizing electrons in a chamber for introduction into the interior region of the passage body.

9. The method of claim 8, wherein the monitoring step (b) comprises the step of electrically isolating the passage body from the chamber; and
   wherein the method further comprises the step of electrically connecting the passage body to the chamber during treatment of the one or more workpieces with the ion beam.

10. A charge neutralization apparatus for use in an ion implantation system that generates an ion beam to treat one or more workpieces, the apparatus comprising:
    (a) means for producing neutralizing electrons in a region through which the ion beam passes in treating one or more workpieces; and
    (b) means for monitoring current flowing through a target electrode positioned to collect neutralizing electrons produced in the region to determine available charge neutralization electron current.

11. The apparatus of claim 10, wherein the monitoring means comprises means for biasing the target electrode with a voltage.

12. The apparatus of claim 10, wherein the neutralizing electron producing means comprises means for producing a plasma comprising neutralizing electrons in the region through which the ion beam passes.

13. The apparatus of claim 10, wherein the monitoring means comprises means for monitoring current flowing through the target electrode while the ion beam is absent from the region.

14. The apparatus of claim 10, comprising means for comparing the monitored current with a predetermined current level.

15. The apparatus of claim 10, comprising means for monitoring a voltage level at the target electrode.

16. The apparatus of claim 10, wherein the target electrode is a passage body defining an interior region through which the ion beam passes.

17. The apparatus of claim 16, wherein the monitoring means comprises means for electrically isolating the passage body from the neutralizing electron producing means while monitoring current flowing through the passage body and means for electrically connecting the passage body to the electron neutralizing producing means during treatment of the one or more workpieces with the ion beam.

18. The apparatus of claim 10, in combination with means for generating and directing the ion beam through the region and means for supporting the one or more workpieces for treatment with the ion beam.

19. A charge neutralization system for use in an ion implantation system that generates an ion beam to treat one or more workpieces, the system comprising:

(a) an electron flood system for producing neutralizing electrons in a region through which the ion beam passes in treating one or more workpieces; and (b) circuitry for monitoring current flowing through a target electrode positioned to collect neutralizing electrons produced in the region to determine available charge neutralization electron current.

20. The system of claim 19, wherein the circuitry biases the target electrode with a voltage while monitoring current flowing through the target electrode.

21. The system of claim 19, wherein the electron flood system is a plasma electron flood system.

22. The system of claim 19, wherein the circuitry monitors current flowing through the target electrode while the ion beam is absent from the region.

23. The system of claim 19, comprising a data processing system for comparing the monitored current with a predetermined current level.

24. The system of claim 19, comprising circuitry for monitoring a voltage level at the target electrode.

25. The system of claim 19, wherein the target electrode is a passage body defining an interior region through which the ion beam passes.

26. The system of claim 25, wherein the circuitry electrically isolates the passage body from the electron flood system while monitoring current flowing through the passage body and electrically connects the passage body to the electron flood system during treatment of the one or more workpieces with the ion beam.

27. The system of claim 19, in combination with an ion beam source for generating and directing the ion beam through the region and an implantation station for supporting the one or more workpieces for treatment with the ion beam.

* * * * *